(12) United States Patent
Nakayama (10) Patent No.: US 8,225,253 B2
(45) Date of Patent: Jul. 17, 2012

(54) REDUNDANT LOGIC CIRCUIT DETECTION METHOD AND DEVICE AND COMPUTER-READABLE RECORDING MEDIUM

(75) Inventor: Noriyasu Nakayama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 83 days.

(21) Appl. No.: 12/875,236

(22) Filed: Sep. 3, 2010

(65) Prior Publication Data
US 2011/0061033 A1    Mar. 10, 2011

(30) Foreign Application Priority Data
Sep. 4, 2009   (JP) .................................. 2009-204193

(51) Int. Cl.
  *G06F 17/50* (2006.01)
  *G06F 9/455* (2006.01)
(52) U.S. Cl. ...................................................... 716/107
(58) Field of Classification Search .................... 716/107
  See application file for complete search history.

(56) References Cited

U.S. PATENT DOCUMENTS

| | | | |
|---|---|---|---|
| 5,796,622 A | 8/1998 | Noseyama | |
| 6,295,628 B1 | 9/2001 | Nakamura | |
| 6,336,205 B1 * | 1/2002 | Kurokawa et al. | 716/113 |
| 6,557,147 B1 * | 4/2003 | Lee et al. | 716/106 |
| 7,287,235 B1 * | 10/2007 | Hasteer et al. | 716/107 |
| 7,337,100 B1 * | 2/2008 | Hutton et al. | 703/13 |
| 7,412,677 B1 * | 8/2008 | Manohararajah et al. | 716/132 |
| 7,757,189 B1 * | 7/2010 | Pedersen et al. | 716/106 |
| 2003/0125920 A1 * | 7/2003 | Matsuoka et al. | 703/15 |
| 2004/0261043 A1 * | 12/2004 | Baumgartner et al. | 716/4 |
| 2005/0010888 A1 * | 1/2005 | Smith et al. | 716/10 |

FOREIGN PATENT DOCUMENTS

| | | |
|---|---|---|
| JP | 5-20383 | 1/1993 |
| JP | 9-34927 | 2/1997 |
| JP | 10-21291 | 1/1998 |
| JP | 11-85832 | 3/1999 |

* cited by examiner

*Primary Examiner* — Suresh Memula
(74) *Attorney, Agent, or Firm* — Fujitsu Patent Center (57) ABSTRACT

A redundant logic circuit detection method includes storing unit-logic-circuit information, waveform data and a limiting condition in a storage section. The unit-logic-circuit information indicates a plurality of unit-logic-circuits synthesized based on logic design information. The waveform data indicates a logic simulation result with respect to the plurality of unit-logic-circuits. The limiting condition defines a comparison condition of the waveform data. The method selects a first unit-logic-circuit from the plurality of unit-logic-circuits. The method detects a second unit-logic-circuit having a substantially identical sequence of the waveform data to the first unit-logic-circuit based on the limiting condition. The method outputs the first unit-logic-circuit and the second unit-logic-circuit as redundant circuit information.

17 Claims, 12 Drawing Sheets

REDUNDANT LOGIC CIRCUIT DETECTION METHOD AND DEVICE AND COMPUTER-READABLE RECORDING MEDIUM

CROSS-REFERENCE TO RELATED APPLICATION

This application is based upon and claims the benefit of priority of Japanese Patent Application No. 2009-204193, filed on Sep. 4, 2009, the entire contents of which are incorporated herein by reference.

FIELD

The embodiments discussed herein relate to a redundant logic circuit detection method and a redundant logic circuit detection device.

BACKGROUND

In a large scale logic circuit design, redundant logic circuits, in other words, overlapping logic circuits, are integrated and shared on the basis of logic design information of a logic circuit. In this way, the logic circuit is reduced, and thus an amount of hardware is reduced.

For example, JP-A-10-021291 discloses a logic synthesis method and a logic synthesis device using similar partial circuit extraction. In JP-A-10-021291, it is proposed that a hardware description language is inputted, a common logic is extracted from inputted logic information, and the common logic is converted into a form to be shared and referred as a low-level layer while considering synthesis performance. A common logical formula is detected in order to share a calculating unit.

On the other hand, JP-A-11-85832 discloses a circuit conversion method, a circuit design support device, and a recording medium. In JP-A-11-85832, it is proposed that a correspondence relationship between a control condition and a data calculator is extracted from inputted circuit description, and the control condition and the data calculator are integrated together on the basis of the determination of the data calculator.

JP-A-9-34927 discloses a logic simulation device and a logic circuit information creating method. In JP-A-9-34927, it is proposed that a conditional statement indicating a condition of input versus output is searched from input macro logic description information, intermediate logic description information to which state transition information is added on the basis of the searched conditional statement is generated, a logic simulation of the input macro logic description information or the like is performed and state value information is outputted, a fixed conditional statement for redundant function is determined and extracted on the basis of the state value information, and a new logic description is generated by deleting the fixed conditional statement from the input macro logic description information on the basis of the determination result.

However, in case a redundant register or counter are purposely arranged by a designer of the logic circuit, the purposed redundant register and counter are recognized as a necessary function, and therefore, not shared based on the conventional logic design information. Consequently, according to the above described method in related art, a logic circuit including the purposed redundant register and counter is not detected as a common logic but still remains. This may cause problems in circuit size, power consumption, and verifiability of a large scale integrated circuit (LSI).

SUMMARY

According to an embodiment of the invention, a redundant logic circuit detection method includes storing unit-logic-circuit information, waveform data and a limiting condition into a storage section. The unit-logic-circuit information indicates a plurality of unit-logic-circuits synthesized based on logic design information. The waveform data indicates a logic simulation result with respect to the plurality of unit-logic-circuits. The limiting condition defines a comparison condition of the waveform data. The method selects a first unit-logic-circuit from the plurality of unit-logic-circuits. The method detects a second unit-logic-circuit having a substantially identical sequence of the waveform data to the first unit-logic-circuit based on the limiting condition. The method outputs the first unit-logic-circuit and the second unit-logic-circuit as redundant circuit information.

BRIEF DESCRIPTION OF DRAWINGS

The above-described and other features of the invention will become apparent from the following description of the embodiments in conjunction with the accompanying drawings, wherein.

DESCRIPTION OF EMBODIMENTS

The inventor focused on issues that the purposed redundant register and counter are recognized as a necessary function in case a redundant register or counter are purposely arranged by a designer of the logic circuit, and therefore, not shared based on the conventional logic design information. Consequently, according to the above described method in related art, a logic circuit including the purposed redundant register and counter is not detected as a common logic but still remains. This may cause problems in circuit size, power consumption, and verifiability of a large scale integrated circuit (LSI).

Hereinafter, various embodiments of the present invention will be described with reference to the attached drawings. In the drawings, dimensions and/or proportions may be exaggerated for clarity of illustration.

Figure 1:
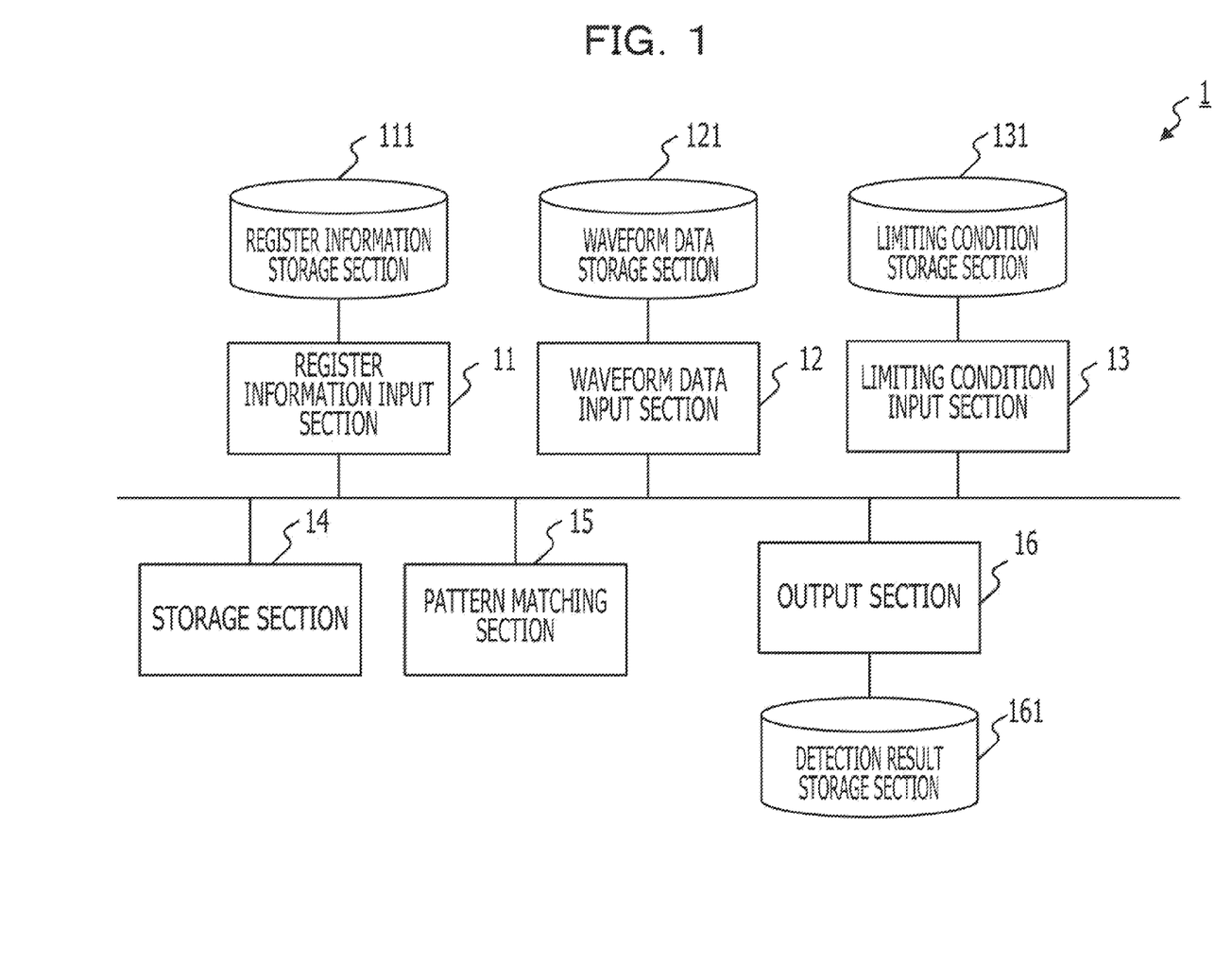
FIG. 1 is a diagram showing an example of a configuration of a redundant logic circuit detection device.

FIG. 1 is a diagram showing an example of a configuration of a redundant logic circuit detection device.

The redundant logic circuit detection device 1 in FIG. 1 is, for example, a redundant register detection device which detects a redundant register. Therefore, a unit-logic-circuit to be detected, which is a redundant circuit, is a register. Hence, the redundant logic circuit detection device 1 includes a register information input section 11, a waveform data input section 12, a limiting condition input section 13, a storage section 14, a pattern matching section 15, an output section 16, a register information storage section 111, a waveform data storage section 121, a limiting condition storage section 131, and a detection result storage section 161.

The register information input section 11 reads register information stored in the register information storage section 111 and inputs or stores the register information in the storage section 14. The register information indicates a plurality of registers synthesized on the basis of logic design information of a logic circuit, and indicates names of the plurality of registers.

The register information storage section 111 stores the register information, preferably in advance. The register information is synthesized by a logic synthesis tool on the basis of the logic design information of the logic circuit, and for example, inputted from the logic synthesis tool (compiler). The register information includes names of each register (register names) in a target logic circuit. For example, the register names are generated on the basis of a description of an RTL (Register Transfer Level). Specifically, the register names are obtained by compiling the RTL.

The description of the RTL is converted into a logic circuit in which logic gates are combined by a well-known logic synthesis software tool. A unique name is given to the converted logic circuit. For example, a register name is given to a register. The redundant logic circuit detection device 1 uses the register names when detecting a redundant logic circuit.

The waveform data input section 12 reads waveform data stored in the waveform data storage section 121, and inputs (stores) the waveform data in the storage section 14. The waveform data is an execution result of logic simulation of the logic circuit including a plurality of registers.

Specifically, the register data is data in which temporal transition of values (logical values) of input/output ports, registers, and signals in the circuit are recorded. The pattern matching section 15 in FIG. 1 uses a portion in which the temporal transition of values (output values) of registers is recorded in the waveform data. The redundant circuit includes circuits which have a sequence common (equal) to each other. The sequence indicates that values of data and sequences of the values (data patterns) are the same in the waveform data.

The waveform data storage section 121 stores the waveform data in advance. The waveform data is an execution result of logic simulation of the logic design information of the logic circuit by a logic simulator, and, for example, inputted from the logic simulator. Specifically, waveform data related to an input into a logic circuit and inputs/outputs to/from a circuit including a plurality of registers in the logic circuit responding to the input is stored in the waveform data. For example, waveform data in the logic circuit traced by the logic simulator is stored.

The limiting condition input section 13 reads a limiting condition stored in the limiting condition storage section 131, and stores the limiting condition in the storage section 14. The limiting condition is a condition for defining a comparison condition of the waveform data, in other words, a condition for pattern matching processing in the pattern matching section 15.

The limiting condition storage section 131 stores the limiting condition in advance. As the above described limiting condition, in a sequence of the waveform data of a register (hereinafter, first register) included in a plurality of registers, the limiting condition defines a start point, an end point, and a length of an interval used to detect a register (hereinafter, second register) other than a first register included in the plurality of registers. The start point and the end point are defined on the basis of, for example, a clock in the sequence. The length is an interval from the start point to the end point in the sequence (hereinafter, the interval is referred to as "throughput length"). The limiting condition is inputted into the limiting condition storage section 131, for example, by a user.

As described above, the storage section 14 stores the register information inputted from the register information input section 11, the waveform data inputted from the waveform data input section 12, and the limiting condition inputted from the limiting condition input section 13.

The pattern matching section 15 performs pattern matching on the sequences of the waveform data of a plurality of registers included in the register information by referring to the register information, the waveform data, and the limiting condition stored in the storage section 14. When the sequences of the waveform data of the plurality of registers match, the pattern matching section 15 stores the result (detection result) in the storage section 14 and notifies the output section 16 of the result.

Specifically, the pattern matching section 15 detects the second register having a sequence of the waveform data matching the sequence of the waveform data of the first register based on the limiting condition. There may be a plurality of second registers. To detect the second register, the pattern matching section 15 compares an interval defined by the limiting condition of the sequence of the waveform data of the first register with the sequence of the waveform data of the second register.

The first register is selected from a plurality of registers included in the register information. On the basis of this selection, the sequence of the waveform data of the first register included in the waveform data is read. The second register is selected from the plurality of registers included in the register information except for the first register. On the basis of this selection, the sequence of the waveform data of the second register included in the waveform data is read.

The pattern matching section 15 detects a common (equal) sequence by comparing the read sequence of the first register and the read sequence of the second register. In other words, the pattern matching section 15 checks whether or not the output patterns match each other on the basis of bit positions of output ports of the first and the second registers in a time axis direction of the sequences of the waveform data to be compared. When the output patterns match each other, the pattern matching section 15 determines that the sequences are a common sequence. The pattern matching processing of the pattern matching section 15 will be described below with reference to FIGS. 3 and 4.

The output section 16 outputs the pair of the first register and the second register detected by the pattern matching section 15 as redundant circuit information. To do this, the output section 16 reads the pair of the first register and the second register detected by the pattern matching section 15 from the storage section 14, and outputs the pair to the detection result storage section 161 as the redundant circuit information.

A designer of the logic circuit refers to the redundant circuit information which is obtained by the above processing and stored in the detection result storage section 161. In this way, the designer can know whether or not there is a redundant circuit in the logic circuit, and in particular the designer can know the pair of the registers detected as the redundant circuit.

Thereafter, for example, in a design of the logic circuit, the designer can reduce the redundant register purposely arranged by another designer. As a result, a semiconductor integrated circuit can be downsized, and power consumption can be reduced. Further, it is possible to successfully perform equivalence checking which uses a high-level equivalence checking technique such as C description vs. RTL, which can facilitate logic verification of a logic circuit.

Figure 2:
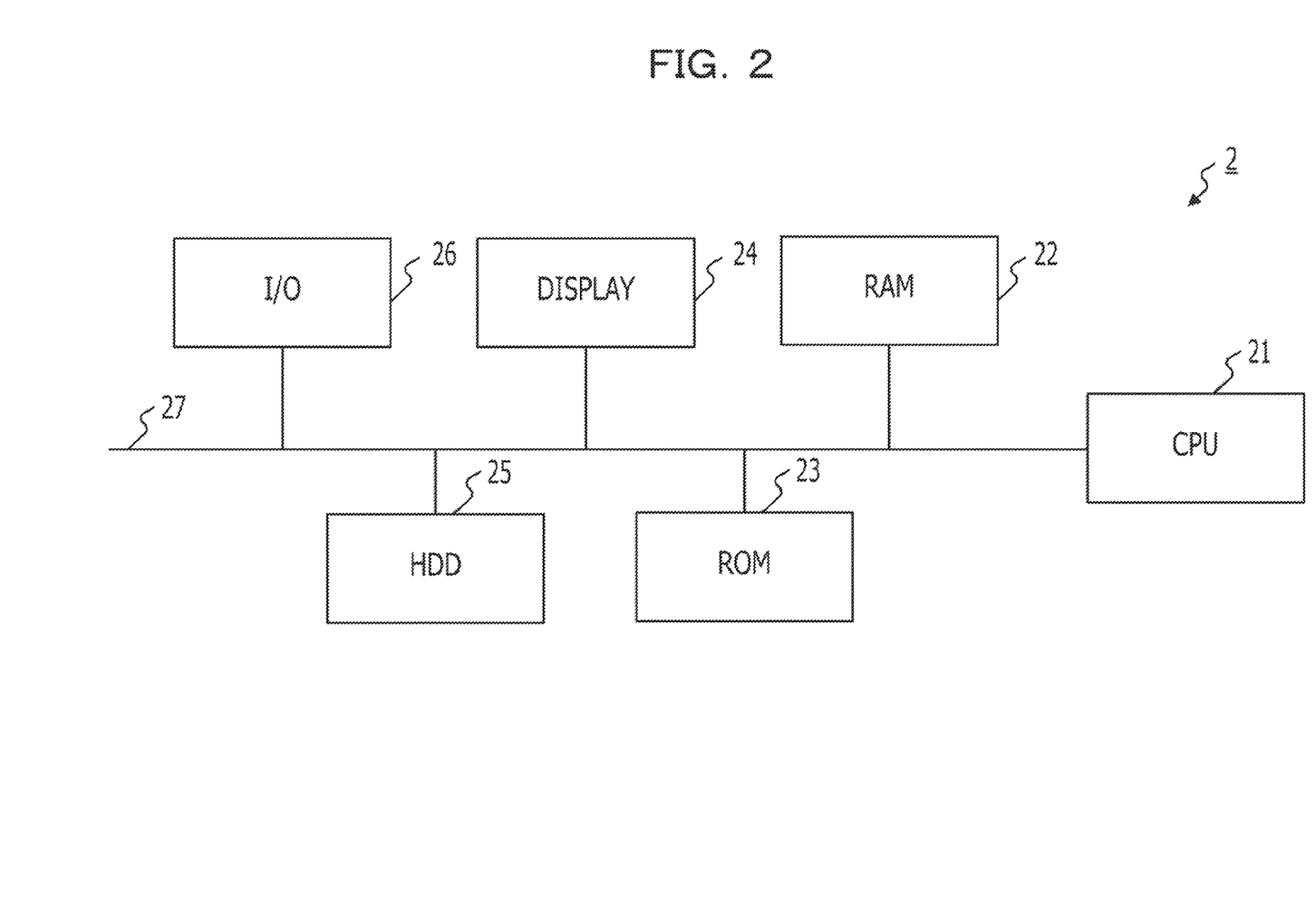
FIG. 2 is a diagram showing an example of a hardware configuration of the redundant logic circuit detection device.

FIG. 2 is a diagram showing an example of a hardware configuration of the redundant logic circuit detection device 1.

A computer, which may be the redundant logic circuit detection device 1, includes a CPU 21, a RAM 22, a ROM 23, a display 24, a magnetic disk device (HDD) 25, an input/output device (I/O) 26, and a bus 27 for connecting the above components.

For example, the register information input section 11, the waveform data input section 12, the limiting condition input section 13, the pattern matching section 15, and the output section 16 may be in the CPU 21 and the RAM 22, and realized by processing programs executed on the CPU 21. The RAM 22 is, for example, a main memory used by the CPU 21. The storage section 14 is provided in the RAM 22. The register information storage section 111, the waveform data storage section 121, the limiting condition storage section 131, and the detection result storage section 161 may be provided in the HDD 25. The user inputs the limiting condition into the storage section 131 by using, for example, the I/O 26 and the display 24.

Figure 3:
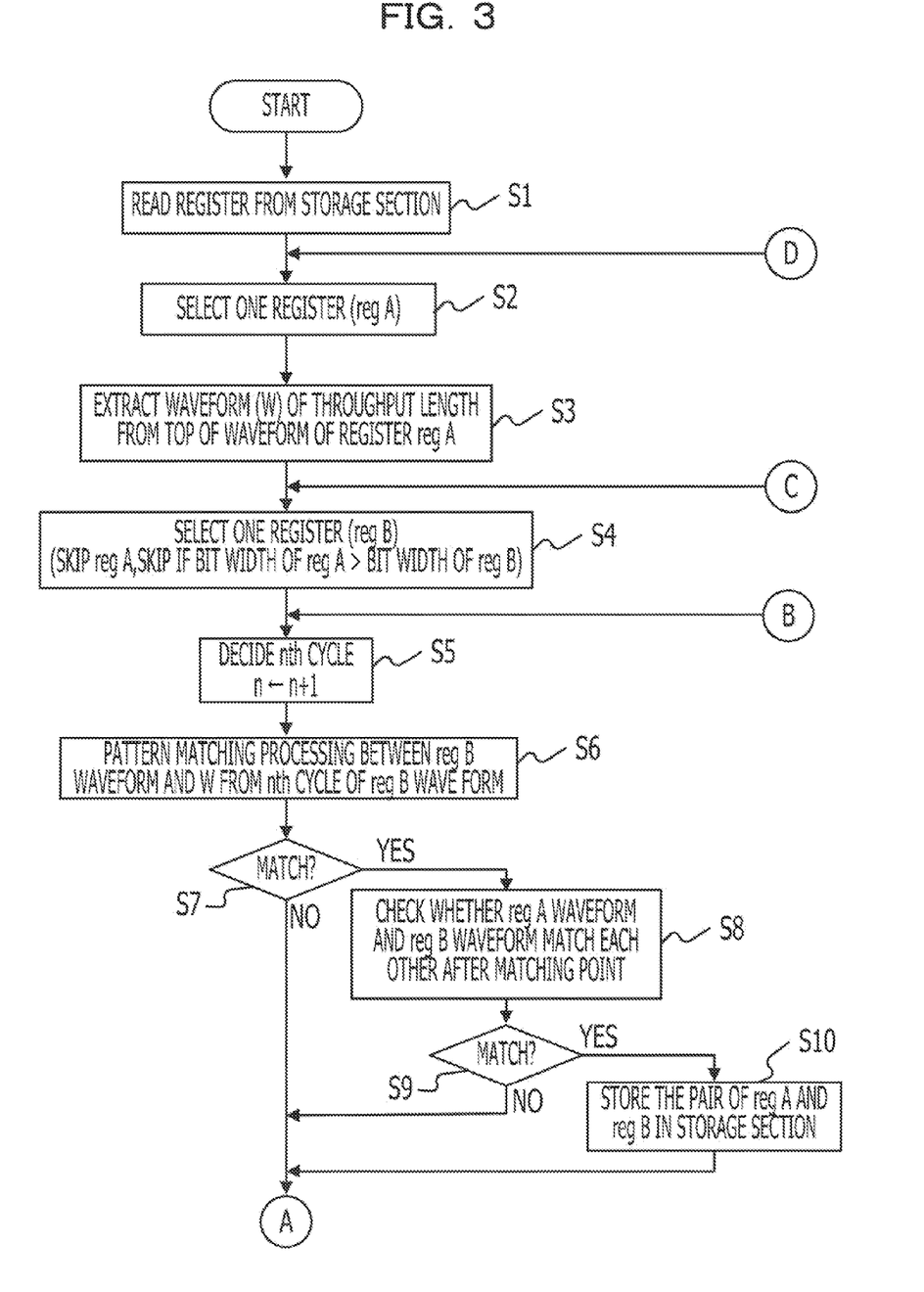
FIG. 3 is a diagram showing an exemplary redundant logic circuit detection process flow.
Figure 4:
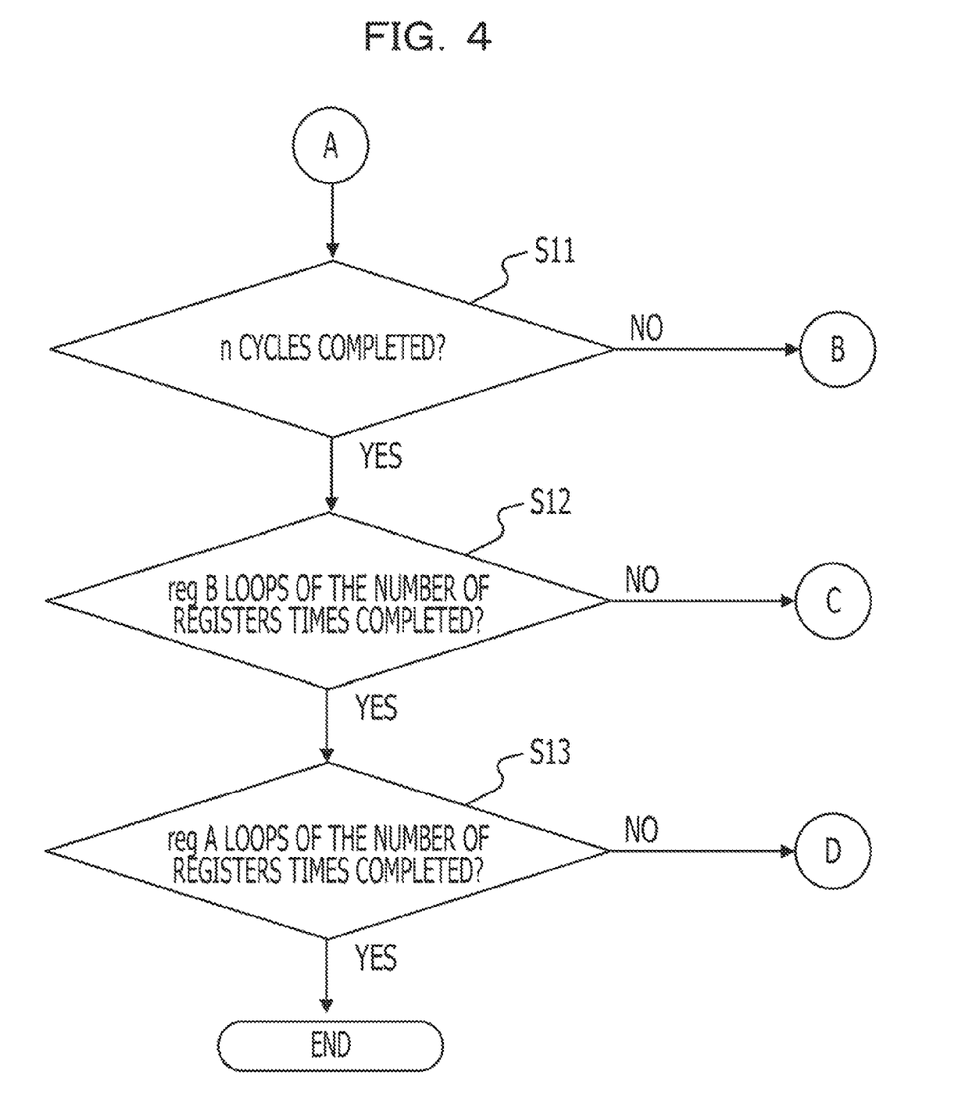
FIG. 4 is a diagram showing an exemplary redundant logic circuit detection process flow.

Next, redundant register detection processing performed by the pattern matching section 15 in the redundant logic circuit detection device 1 will be described with reference to FIGS. 3 and 4. FIGS. 3 and 4 jointly show a redundant logic circuit detection process flow performed by the pattern matching section 15.

The pattern matching section 15 reads the limiting condition from the storage section 14 before starting the pattern matching processing. Thereafter, the pattern matching section 15 reads the register information including a plurality of registers from the storage section (step S1), and selects a first register reg A from the read register information (step S2).

The pattern matching section 15 extracts a sequence of the waveform data of the register reg A stored in the storage section 14, in other words, extracts a waveform (waveform W) of a throughput length starting from the top of the waveform (step S3).

Although the waveform W of the throughput length starting from the top of the waveform of the waveform data of the register reg A is extracted in step S3, the waveform W is not limited to this. For example, the waveform W may be extracted from a position other than the top of the waveform of the waveform data of the register reg A.

The pattern matching section 15 selects a second register reg B from the plurality of registers included in the read register information after skipping (excluding) the register reg A (step S4). At this time, the pattern matching section 15 may exclude not only the register reg A but also registers having a bit width larger than the bit width of the register reg A from the selection target of the register reg B.

This is because, in this case, the waveform of the register reg A having a small bit width does not match the waveform of the register reg B having a large bit width. On the contrary, as described below, the waveform of the register reg B having a large bit width may partially match the waveform of the register reg A having a small bit width. Therefore, as described below, in this case, the waveform of the register reg A having a small bit width is checked whether or not the waveform thereof partially matches the waveform of the register reg B having a large bit width.

The pattern matching section 15 decides an "nth cycle" on the basis of the limiting condition stored in the storage section 14 (step S5). Here, the initial value of n is "0". The cycle is a cycle of an operation clock supplied to the logic circuit. Based on this, the pattern matching section 15 repeats the pattern matching processing while incrementing the number of the cycles by "+1" from the top of the waveform data of the register reg B which is the first (=0+1) cycle until the cycles reach the throughput length.

The pattern matching section 15 performs pattern matching processing between the nth cycle of the waveform data of the register reg B and the waveform W (step S6). In other words, the pattern matching section 15 sequentially compares a value of the nth cycle of the waveform data of the register reg B and a value of each cycle of the waveform W from the top (first cycle) of the waveform W. In this way, in the waveform W, a cycle (matching cycle) matching the nth cycle of the waveform data of the register reg B is detected.

Thereafter, the pattern matching section 15 checks whether or not the value of the nth cycle of the waveform data of the register reg B matches the value of each cycle of the waveform W (step S7). In this way, the top of the interval in which both values match each other can be detected.

When a pattern of nth cycle of the waveform of the register B and a pattern of the waveform W do not match each other (step S7: No), the pattern matching section 15 determines whether or not the pattern matching of the throughput length is completed by performing pattern matching of nth cycle (step S11).

When the pattern matching of the throughput length is completed (step S11: Yes), the pattern matching section 15 determines whether or not the registers reg B, the number of which corresponds to the number of the second registers reg B in the register information, have been selected (determines whether or not the loop of the register reg B is completed) (step S12).

When the registers reg B, the number of which corresponds to the number of the second registers reg B, have been selected (step S12: Yes), the pattern matching section 15 further determines whether or not the registers reg A, the number of which corresponds to the number of the first registers reg A in the register information, have been selected (determines whether or not the loop of the register reg A is completed). When the registers reg A, the number of which corresponds to the number of the first registers reg A, have been selected (step S13: Yes), the pattern matching section 15 ends the pattern matching processing.

On the other hand, when the pattern of nth cycle of the waveform of the register B and the pattern of the waveform W match each other (step S7: Yes), the pattern matching section 15 performs pattern matching processing between the waveform of the register reg A and the waveform of the register reg B in the cycles following the matching cycle (step S8).

Thereafter, the pattern matching section 15 checks whether or not the sequence of the waveform W of the register reg A and the sequence of the waveform of the register reg B match each other (step S9). In this way, it is possible to detect the register reg B having the same sequence as the sequence of the waveform W.

When the sequence of the waveform W of the register reg A and the sequence of the waveform of the register reg B do not match each other (step S9: No), step S11 is performed. When the sequence of the waveform W of the register reg A and the sequence of the waveform of the register reg B match each other (step S9: Yes), the pattern matching section 15 stores the pair of the register reg A and the register reg B in the storage section 14 as redundant circuit information (step S10), and performs step S11.

In step S11, when the pattern matching of the throughput length is not completed by the pattern matching of nth cycle (step S11: No), step S5 is performed.

In step S12, when the registers reg B the number of which is smaller than the number of the second registers reg B are selected (step S12: No), step S4 is performed.

In step S13, when the registers reg A the number of which is smaller than the number of the first registers reg A are selected (step S13: No), step S2 is performed.

Figure 5:
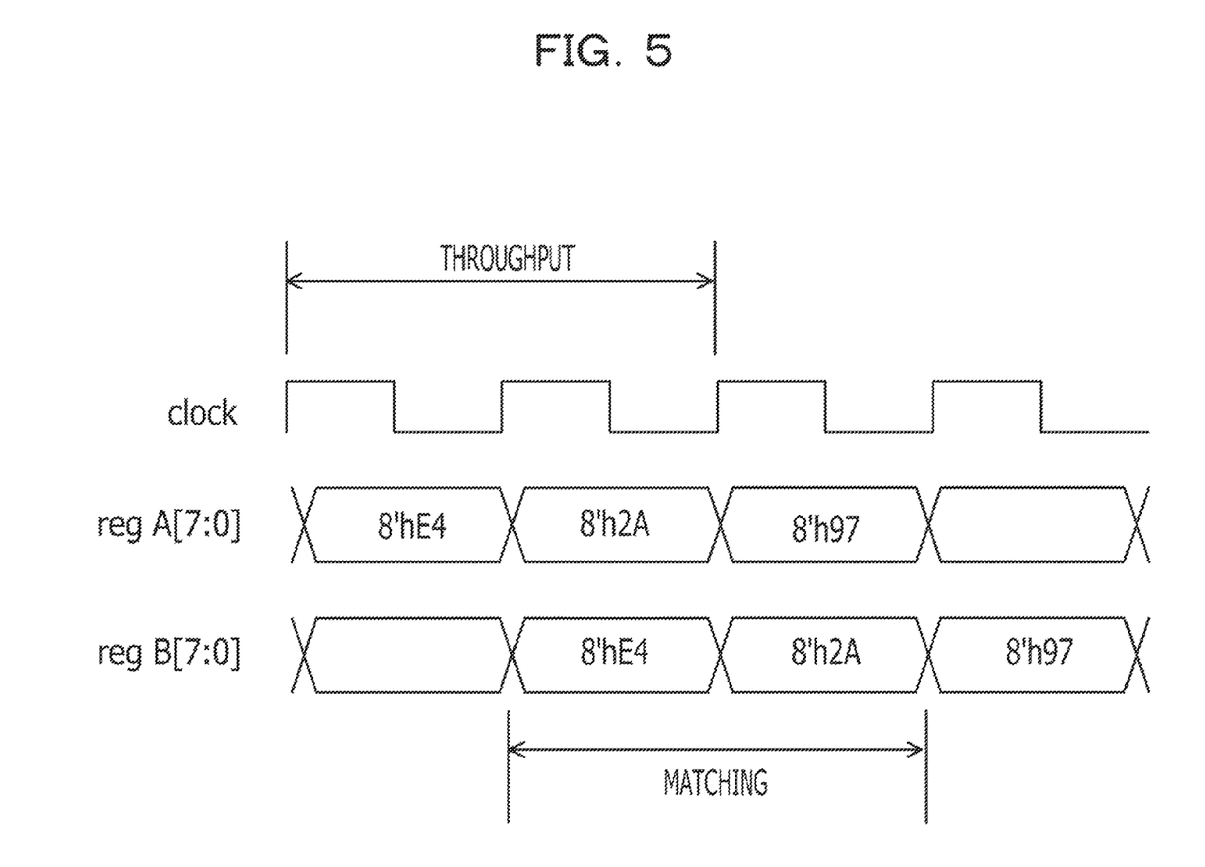
FIG. 5 is a diagram explaining an example of redundant register detection processing.

Next, the detection processing of redundant logic circuit will be described with reference to FIG. 5. FIG. 5 is a diagram explaining an example of the redundant register detection processing.

In FIG. 5, both the first register reg A and the second register reg B have a bit width of "8". As shown in FIG. 5, the waveform data of the first register reg A has a changing sequence such as "8'hE4" to "8'h2A" to "8'h97" in 8-bit data. The waveform data of the second register reg B has, for example, a changing sequence such as "8'hE4" to "8'h2A" to "8'h97" in 8-bit data.

For example, "8'hE4" indicates "E4" in hexadecimal. The above description is the same for other 8-bit data. As the limiting condition, the throughput length is defined to be two clock cycles. Therefore, the sequence of "8'hE4" and "8'h2A" corresponds to the waveform W of the first logic circuit.

The pattern matching section 15 compares the sequence of the waveform data of the register reg A corresponding to the throughput length with the sequence of the waveform data of the register reg B. Based on this, 8-bit data "8'hE4" of the second cycle of the waveform data of the register reg B matches the top 8-bit data "8'hE4" of the waveform data of the register reg A corresponding to the throughput length. In other words, the cycle of the value "8'hE4" is the matching cycle.

Since the matching cycle is found, the pattern matching section 15 compares the waveform data of the register reg A corresponding to the throughput length with the second and following cycles of the waveform data of the register reg B. In this case, as shown in FIG. 5, both waveform data match each other. Based on this, the pair of the register reg A and the register reg B is detected as a redundant circuit.

In FIG. 5, the start point indicates, for example, a timing to start pattern matching in the throughput length, and corresponds to the top of the throughput length. The throughput length is represented by a time period based on a clock, and corresponds to the length of the waveform data. The end point indicates, for example, a timing to end pattern matching in the throughput length, and corresponds to the end of the throughput length.

The redundant register detection processing performed by the pattern matching section 15 is not limited to the above example. For example, as described below, even when the waveform data of two registers compared with each other partially match each other, the two registers may be detected as redundant registers.

Figure 6:
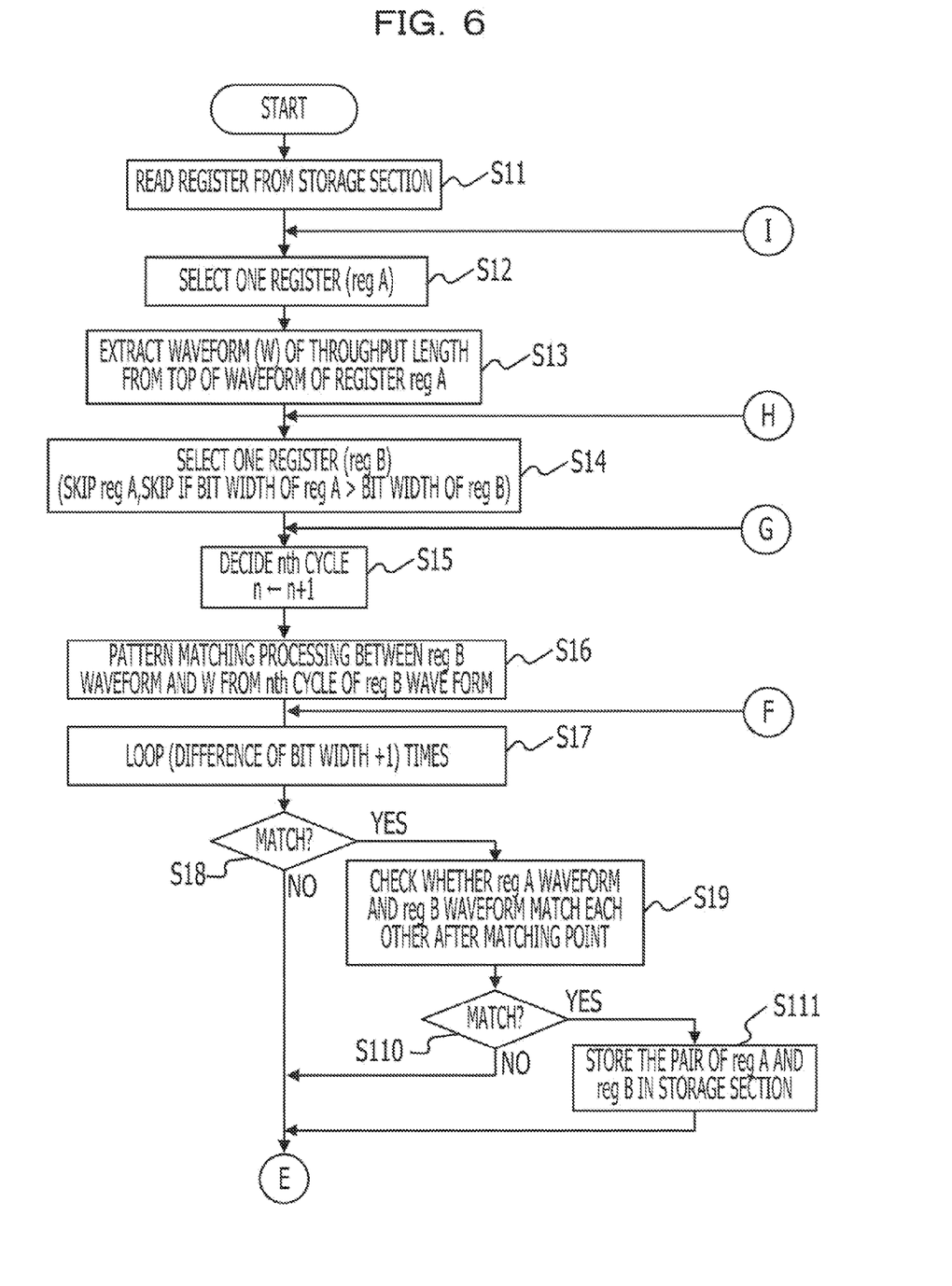
FIG. 6 is a diagram showing an exemplary detection process flow of partial match of redundant logic circuits.
Figure 7:
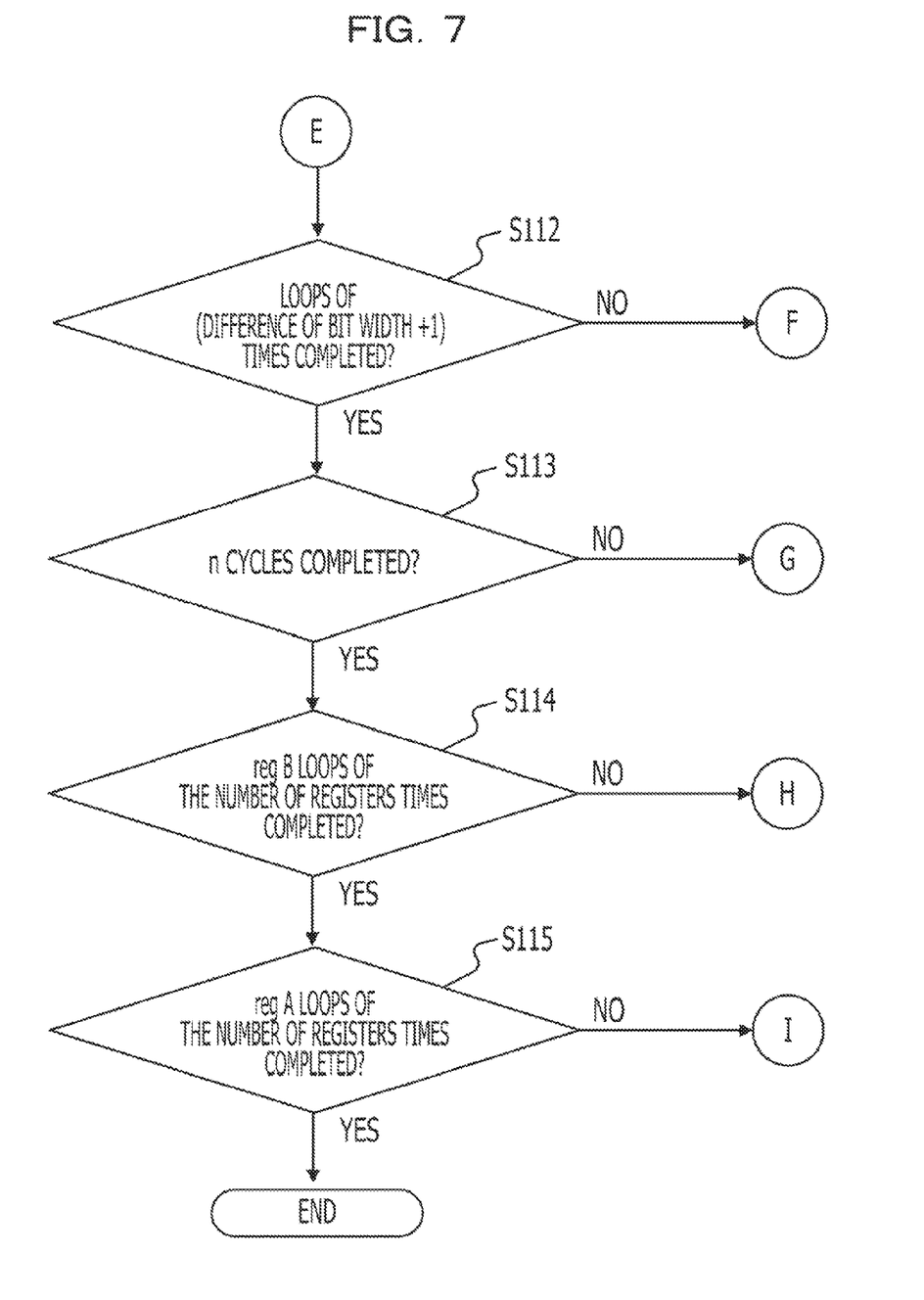
FIG. 7 is a diagram showing an exemplary detection process flow of partial match of redundant logic circuits.

Next, the detection processing of partially matching redundant registers performed by the pattern matching section 15 in the redundant logic circuit detection device 1 will be described with reference to FIGS. 6 and 7. FIGS. 6 and 7 jointly show a redundancy detection process flow of redundant circuit partial matching.

The pattern matching section 15 may perform steps S11 to S16 in substantially the same way as in steps S1 to S6 in FIG. 3.

Next, the pattern matching section 15 sets a parameter for looping the process times (difference of bit width +1) on the basis of the difference of bit width between the register reg A and register reg B to be compared with each other (step S17). The initial value of the parameter is set to, for example, (difference of bit width +1).

Next, the pattern matching section 15 may perform steps S18 to S111 in substantially the same way as in steps S7 to S10 in FIG. 3.

Next, the pattern matching section 15 checks whether or not the (difference of bit width +1) times loop is completed (step S112). For example, the pattern matching section 15 decreases the parameter by "1" and checks whether or not the value of the parameter is "0". When the (difference of bit width +1) times loop is not completed (step S112: No), the pattern matching section 15 repeats step S17. When the (difference of bit width +1) times loop is completed (step S112: Yes), the pattern matching section 15 may perform steps S113 to S115 in substantially the same way as in steps S11 to S13 in FIG. 4.

Figure 8:
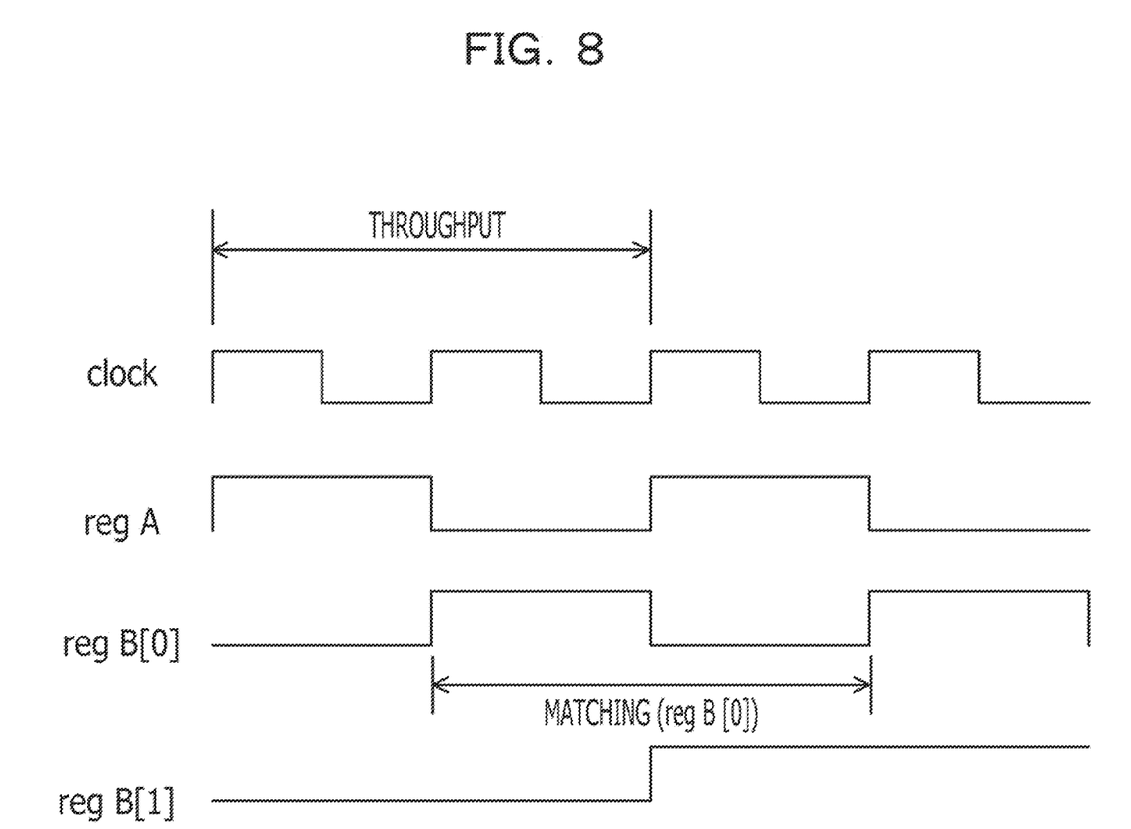
FIG. 8 is a diagram explaining an example of redundant register partial match detection processing.

FIG. 8 is a diagram explaining an example of redundant register partial match detection processing.

In FIG. 8, the register reg A is a register having a bit width of "1", and the register reg B is a register having a bit width of "2". As described above, in the process of FIGS. 3 and 4, the pattern matching section 15 also excludes registers having a bit width larger than the bit width of the register reg A from the selection target of the register reg B. Therefore, the example in FIG. 8 is an example in which registers having a bit width larger than the bit width of the register reg A are not excluded from the selection target of the register reg B.

In this case, the pattern matching section 15 performs pattern matching between the sequence of the register reg A corresponding to the waveform W and the waveform of the register reg B. Specifically, the pattern matching section 15 compares the sequence of the register reg A and each of the 0-bit signal reg B [0] and the 1-bit signal reg B [1] of the register reg B. In this case, as shown in FIG. 8, the sequence of the register reg A matches the sequence of the register reg B [0]. Based on this, the pair of the register reg A and the register reg B [0] is stored in the storage section 14 as a pair of redundant registers that are estimated to be redundant circuits.

In the redundant register detection processing shown in FIGS. 5 and 8, while not using the bit width of the registers, even when the sequence of the first register reg A and the sequence of the second register reg B do not completely match each other, the registers may be detected as redundant registers.

In this case, for example, the limiting condition defines a matching rate between the sequence of the waveform data of the first register reg A and the sequence of the waveform data of the second register reg B. This rate can be defined empirically, and may be set in advance. The pattern matching section 15 detects a register having a sequence that matches the sequence of the waveform data of the first register reg A at a rate higher than the rate set in advance, as the second register reg B.

For example, after the matching cycle is detected in step S8 in the process of FIGS. 3 and 4, even when the sequence of the waveform data of the first register reg A and the sequence of the waveform data of the second register reg B do not match each other, if the sequences match each other at a rate higher than the rate described above, the registers are detected as a pair of registers that are estimated to be redundant circuits. In this way, registers whose sequences of the waveform data partially match each other can be detected as redundant registers.

Figure 9:
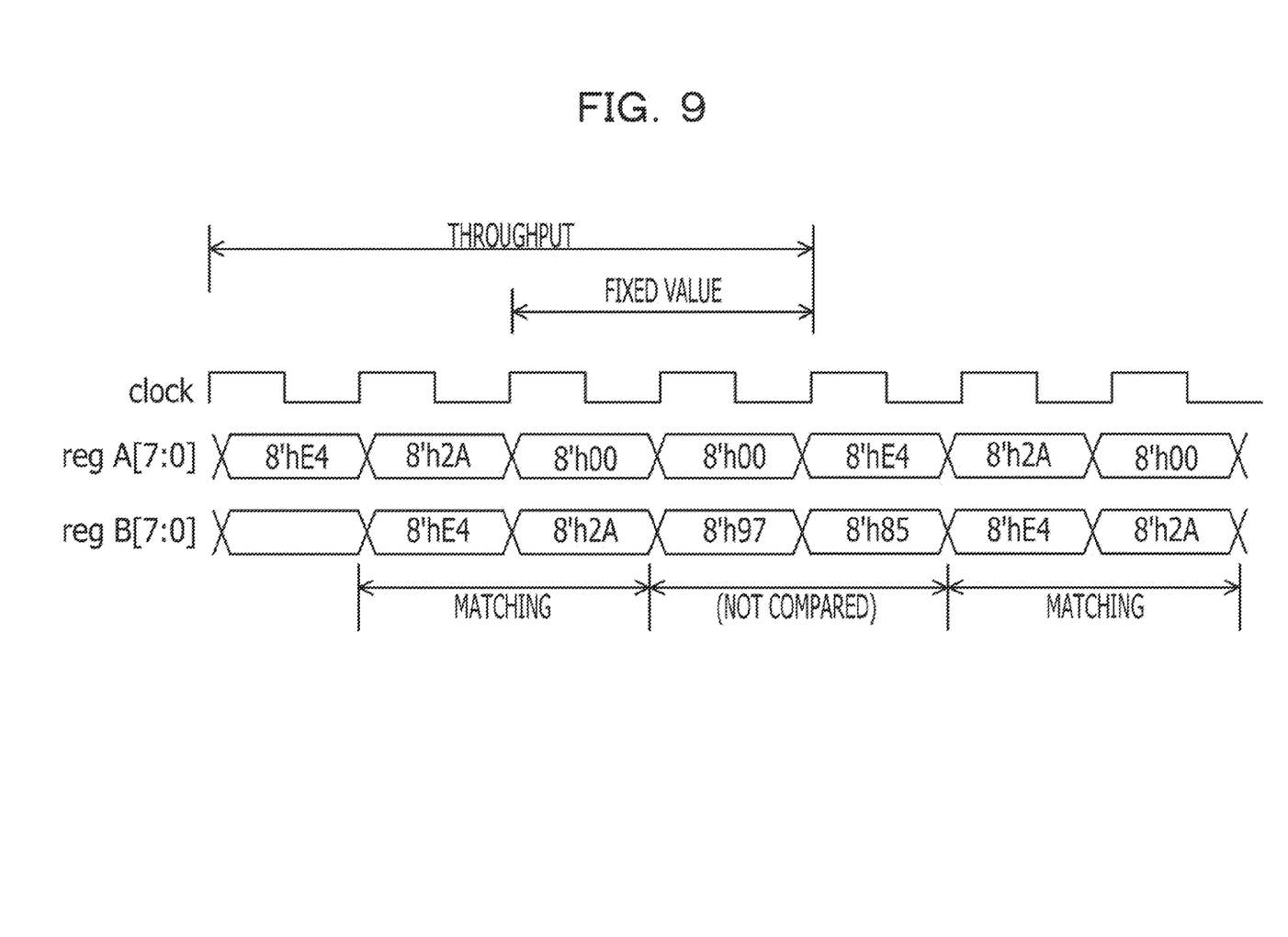
FIG. 9 is a diagram explaining another example of redundant register partial match detection processing.

FIG. 9 is a diagram explaining another example of the redundant register partial match detection processing.

In the redundant register detection processing shown in FIGS. 5 and 8, when the sequence of the first register reg A includes a continuous interval in which a certain value appears in a row, the continuous interval may not be used when comparing with the sequence of the second register reg B.

As shown in FIG. 9, the sequence of the waveform data of the first register reg A may include a continuous interval in which a certain value appears in a row. For example, in one throughput, 8-bit data "8'h00" may appear two times in a row. In this continuous interval, the waveform of the first register reg A is a fixed value.

In this case, for example, the limiting condition defines that, in the sequence of the waveform data of the first register reg A, the continuous interval is a first exclusion interval excluded from a comparison with the sequences of the waveform data of registers other than the first register reg A included in a plurality of registers. The pattern matching section 15 compares an interval in which the first exclusion interval is excluded from the sequence of the waveform data of the first register reg A with the sequences of the waveform data of registers other than the first register reg A included in the plurality of registers. Based on this, the 8-bit data "8'hE4" and "8'h2A", which remain after the 8-bit data "8'h00" is excluded from the throughput of waveform data of the register reg A, match the waveform data of the register reg B. As a result, the second register reg B is detected.

For example, if two registers to be compared with each other have a fixed value in a row, the waveforms of the two registers virtually match each other even when the two registers have no functional relationship therebetween. According to the example of FIG. 9, it is possible not to detect such a virtual match due to continuation of a fixed value.

When the entire sequence of the throughput of the register reg A is formed by a string of the same value (fixed value), the processing of the register reg A is skipped and the pattern matching processing of the next register is performed.

Although FIG. 9 is an example in which the sequence of the first register reg A includes the continuous interval, even when the sequence of the second register reg B includes the continuous interval, the continuous interval may not be used in a comparison with the first register reg A.

In this case, for example, the limiting condition defines that, in the sequences of the waveform data of registers other than the first register reg A included in a plurality of registers, the continuous interval is a second exclusion interval excluded from a comparison with the sequence of the waveform data of the first register reg A. The pattern matching section 15 compares intervals in which the second exclusion interval is excluded from the sequences of the waveform data of the registers other than the first register reg A included in the plurality of registers with the sequence of the waveform data of the first register reg A. In this way, it is possible to detect the second register in the same way as in the example of FIG. 9.

While the above example is an example of the redundant register detection processing, the redundant logic circuit is not limited to a register. For example, it is possible to detect a redundant counter as a redundant logic circuit.

Figure 10:
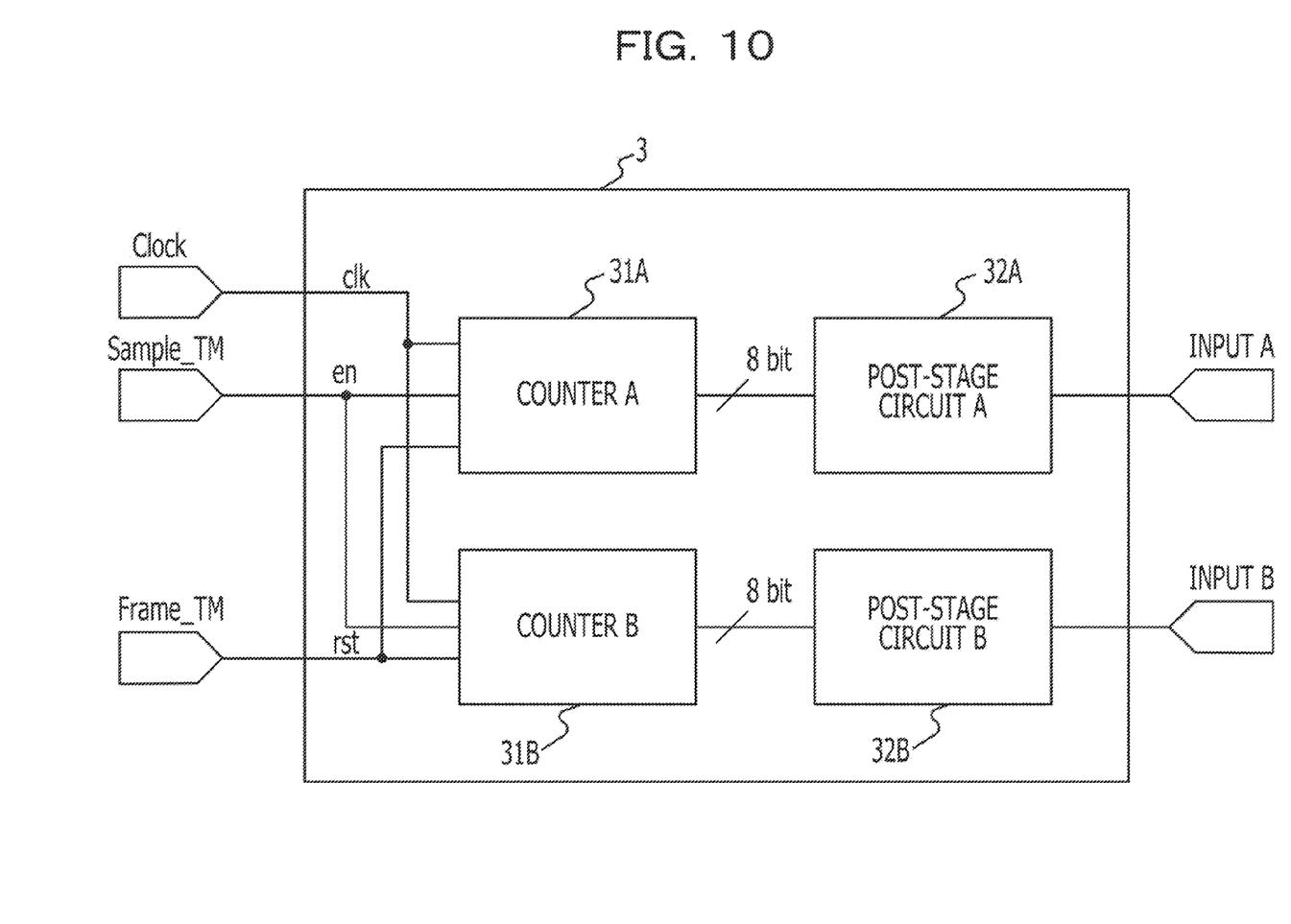
FIG. 10 is a diagram explaining an example of redundant counter detection processing.

FIG. 10 shows an example of the redundant counter detection processing.

In FIG. 10, a circuit 3 includes a redundant circuit to be detected, in other words, it includes a plurality of counters 31 to be detected. Also, the circuit 3 includes a plurality of post-stage circuits 32. In the plurality of counters 31, a counter selected as a first logic circuit is represented by a counter 31A, a counter selected as a second logic circuit is represented by a counter 31B, and the other counters are omitted.

The counter 31A and the counter 31B are circuits redundant each other. The post-stage circuit 32A is a circuit connected to an output of the counter 31A, and the post-stage circuit 32B is a circuit connected to an output of the counter 31B.

A clock clk is inputted into the counter 31A and the counter 31B as an operation clock, a signal Sample is inputted into the counters as an input signal en, and a signal Frame is inputted into the counters as a reset signal rst. The signal Sample is a signal in which "0, 1, 0, 1, . . . " is repeated. The signal Frame is a signal which is "1" in one cycle of the signal Sample for every 256 cycles of the signal Sample, and "0" in the other cycles.

The output of the counter 31A is reset to "0" at a time when the signal Frame is inputted. The counter 31A counts ("1" of) the signal Sample until the output reaches "15", and when the output reaches "15", the counter 31A continuously outputs "15" until the output is reset. The output of the counter 31B is reset to "0" at a time when the signal Frame is inputted, and the counter 31B counts ("1" of) the signal Sample until the output reaches "255".

Hence, the output of the counter 31A is the same as the output of the counter 31B from the reset to when the output reaches "15" for the first time. Therefore, the counter 31A is considered to be redundant because the counter 31A can be integrated into the counter 31B.

Figure 11:
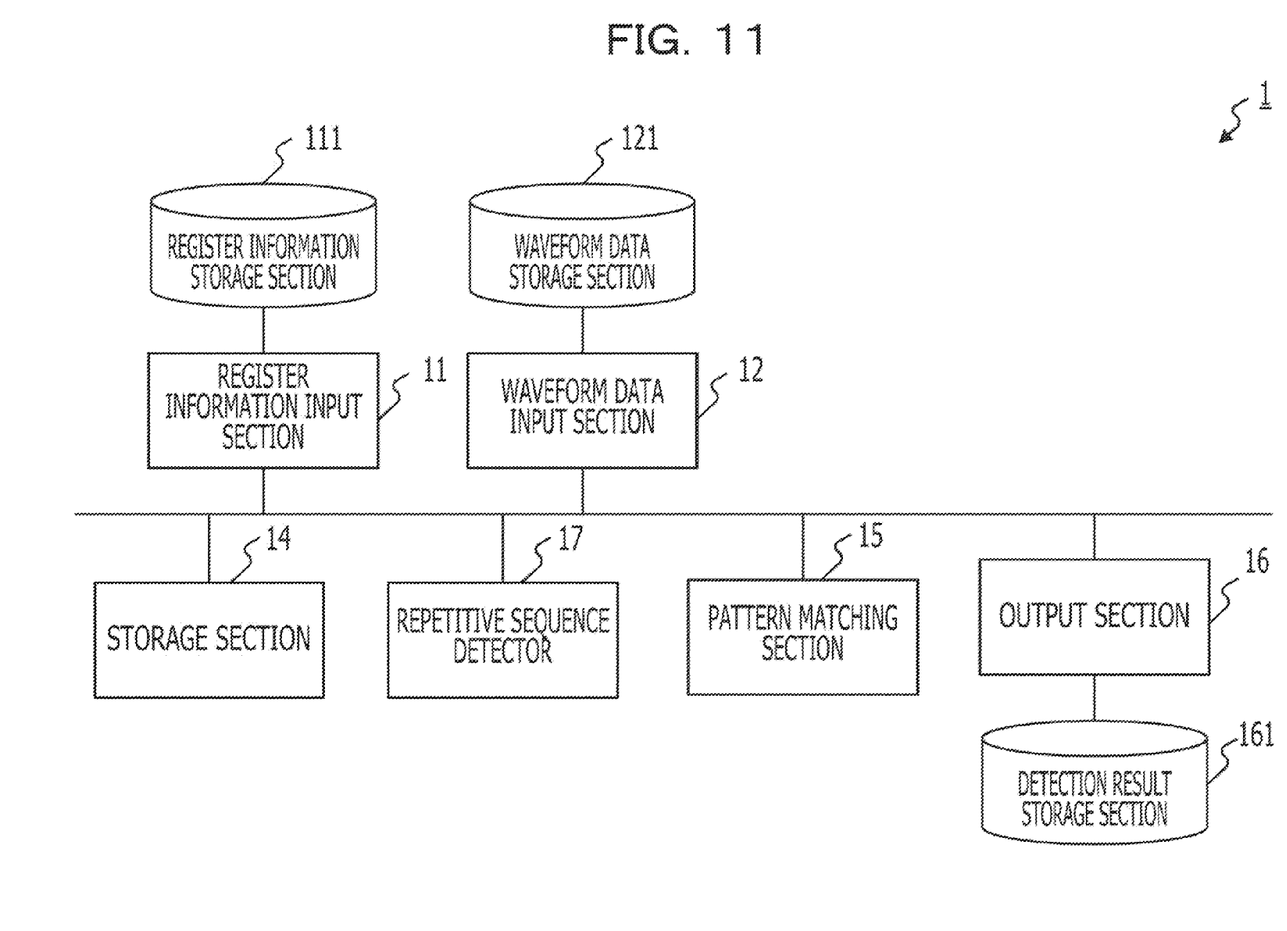
FIG. 11 is a diagram showing another example of a configuration of the redundant logic circuit detection device.

FIG. 11 is a diagram showing another example of a configuration of the redundant logic circuit detection device.

The redundant logic circuit detection device in FIG. 11 does not include the limiting condition input section 13 and the limiting condition storage section 131. Therefore, in the redundant logic circuit detection device in FIG. 11, the register information and the waveform data are prepared. Also, instead of the limiting condition input section 13, a repetitive sequence detector 17 is provided. The repetitive sequence detector 17 detects a repetitive interval in which the same sequence is repeated in the sequence of the waveform data of the first register reg A. The detected logic circuit is not limited to a register.

The pattern matching section 15 uses the repetitive interval detected by the repetitive sequence detector 17 as the start point, the end point, and the length of the interval used for detecting the second register reg B. Specifically, the pattern matching section 15 compares the repetitive interval in the sequence of the waveform data of the first register reg A with the sequences of the waveform data of registers other than the first register reg A. In this way, the pattern matching section 15 detects the second register reg B having a sequence of the waveform data matching the sequence of the waveform data of the first register reg A. Based on this, it is possible to detect a redundant register by using the repetitive interval (repetitive sequence) as a throughput without inputting the limiting condition.

Figure 12:
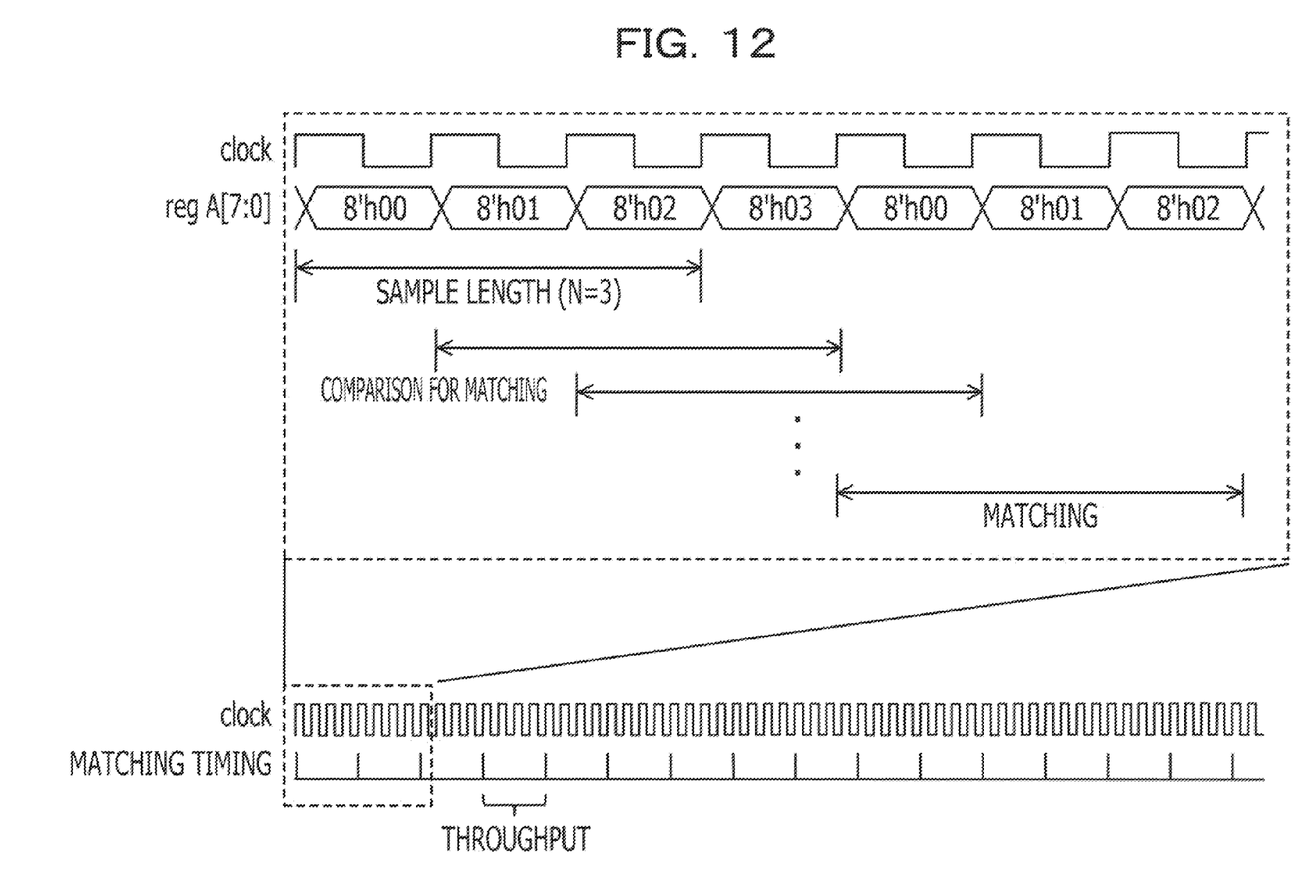
FIG. 12 is a diagram explaining an example of detection processing of repetitive sequence of a redundant register.

Next, the detection processing of the repetitive sequence of a redundant register will be described with reference to FIG. 12. FIG. 12 is a diagram explaining an example of the detection processing of the repetitive sequence of a redundant register.

In FIG. 12, the waveform data of the first register reg A has a changing sequence such as "8'h00" to "8'h01" to "8'h02" to "8'h03" in 8-bit data. For example, when a sample length N is 3, the 8-bit data "8'h00", "8'h01", and "8'h02" are obtained as a sample, and the sample data is compared with successive waveform data by shifting the successive waveform data one cycle by one cycle. In this way, it is detected that the 8-bit data "8'h00", "8'h01", and "8'h02" match the waveform data after 4 cycles. As a result, the interval of the 8-bit data "8'h00", "8'h01", and "8'h02" is determined to be the repetitive interval of the first register reg A. In other words, the 8-bit data "8'h00", "8'h01", and "8'h02" are used to detect the second register reg B.

The sample length is incremented "+1" by "+1" from "2" to a predetermined bit length until a repetitive interval is detected. Samples are obtained from the top of the waveform data by sequentially shifting the waveform data one cycle by one cycle until a repetitive interval is detected.

In the above example, the redundant logic circuit is detected by detecting matching between sequences of the waveform data of two logic circuits. However, in addition to detecting matching between sequences of the waveform data, the redundant logic circuit can be detected by the method described below.

For example, in this method, the limiting condition defines that a register having a sequence of the waveform data that has a constant difference from the sequence of the waveform data of the first register reg A is detected as the second register reg B. The pattern matching section 15 detects a register having a sequence of the waveform data that has a constant difference from the sequence of the waveform data of the first register reg A as the second register.

For example, a difference between output values of two counters may be constant (may be a fixed value). In this case, the sequences of the waveform data of the two counters do not match each other. However, if the difference between output values of the two counters is constant, when a value corresponding to the difference is added to (or subtracted from) the output value of one counter, the output values of both counters become the same. Therefore, the two counters are redundant because the two counters can be integrated. Therefore, the two counters are detected as redundant counters.

All examples and conditional language provided herein are intended for the pedagogical objects to aid the reader in understanding the invention and the concepts contributed by the inventors to further the art, and are to be construed as being without limitation to such specifically recited examples and conditions. Although the embodiments of the invention have been described in detail, it will be understood by those of ordinary skill in the relevant art that various changes, substitutions, and alterations could be made hereto without departing from the spirit and scope of the invention as set forth in the claims.

What is claimed is:

1. A redundant logic circuit detection method comprising:
   storing unit-logic-circuit information, waveform data and a limiting condition in a storage section, the unit-logic-circuit information indicating a plurality of unit-logic-circuits synthesized based on logic design information, the waveform data indicating a logic simulation result with respect to the plurality of unit-logic-circuits, the limiting condition defining a comparison condition of the waveform data;
   selecting a first unit-logic-circuit from the plurality of unit-logic-circuits;
   detecting a second unit-logic-circuit having a substantially identical sequence of the waveform data to the first unit-logic-circuit based on the limiting condition; and
   outputting the first unit-logic-circuit and the second unit-logic-circuit as redundant circuit information.

2. The detection method according to claim 1, wherein the storing includes:
   inputting the unit-logic-circuit information into the storage section by a command from a unit-logic-circuit information input section.

3. The detection method according to claim 1, wherein the storing includes:
   inputting the waveform data into the storage section by a command from a waveform input section.

4. The detection method according to claim 1, wherein the storing includes:
   inputting the limiting condition into the storage section by a command from a limiting condition input section.

5. The detection method according to claim 1, further comprising:
   synthesizing the unit-logic-circuit information by a logic synthesis tool based on the logic design information of a logic circuit.

6. The detection method according to claim 1, wherein the limiting condition defines a start point for pattern matching, an end point for pattern matching, and an interval between the start point and the end point in the sequence of the waveform data of the first unit-logic-circuit for detecting the second unit-logic-circuit.

7. The detection method according to claim 6, wherein the start point and the end point are defined based on a clock in the sequence of the waveform data of the first unit-logic-circuit.

8. The detection method according to claim 7, wherein the interval between the start point and the end point is represented by a time period with respect to the clock.

9. The detection method according to claim 6, wherein the detecting includes:
   detecting the second unit-logic-circuit when the second unit-logic-circuit includes at least the substantially identical sequence of the waveform data matching the specified interval of the first unit-logic-circuit.

10. The detection method according to claim 1, wherein the detecting includes:
    detecting a unit-logic-circuit as the second unit-logic-circuit when the second unit-logic-circuit includes the substantially identical sequence of the waveform data to the first unit-logic-circuit at a higher matching rate than a predetermined matching rate.

11. The detection method according to claim 1, wherein the limiting condition defines a continuous interval where a certain value appears in a row in the sequence of the waveform data of the first unit-logic-circuit as a first exclusion interval, and
    the first exclusion interval is excluded from a comparison condition of the waveform data for detecting the second unit-logic-circuits.

12. The detection method according to claim 1, wherein the limiting condition defines a continuous interval where a certain value appears in a row in the sequence of the waveform data of at least one unit-logic-circuit other than the first unit-logic-circuit as a second exclusion interval, and the second exclusion interval is excluded from a comparison condition of the waveform data for detecting the second unit-logic-circuits.

13. The detection method according to claim 1, further comprising:
  detecting a repetitive interval in a sequence of the waveform data of the first unit-logic-circuit,
  wherein the detecting the second unit-logic-circuit includes detecting a unit-logic-circuit as the second unit-logic-circuit when the second unit-logic-circuit includes a substantially identical sequence of the waveform data to the repetitive interval.

14. A redundant logic circuit detection device comprising:
  a storage section configured to store unit-logic-circuit information indicating a plurality of unit-logic-circuits synthesized based on logic design information into a storage section, waveform data indicating a logic simulation result with respect to the plurality of unit-logic-circuits into the storage section, and storing a limiting condition defining a comparison condition of the waveform data into the storage section;
  a pattern matching section configured to select a first unit-logic-circuit from the plurality of unit-logic-circuits, and detecting a second unit-logic-circuit having a substantially identical sequence of the waveform data to the first unit-logic-circuit based on the limiting condition; and
  an output section configured to output the first unit-logic-circuit and the second unit-logic-circuit as redundant circuit information.

15. The redundant logic circuit detection device according to claim 14, further comprising a repetitive interval detecting unit to detect a repetitive interval in a sequence of the waveform data of the first unit-logic-circuit,
  wherein a unit-logic-circuit is detected as the second unit-logic-circuit when the second unit-logic-circuit includes a substantially identical sequence of the waveform data to the repetitive interval.

16. A non-transitory computer-readable recording medium that stores therein a computer program for detecting a redundant logic circuit, the computer program causes a computer to at least execute:
  storing unit-logic-circuit information, waveform data and a limiting condition in a storage section, the unit-logic-circuit information indicating a plurality of unit-logic-circuits synthesized based on logic design information, the waveform data indicating a logic simulation result with respect to the plurality of unit-logic-circuits, the limiting condition defining a comparison condition of the waveform data;
  selecting a first unit-logic-circuit from the plurality of unit-logic-circuits;
  detecting a second unit-logic-circuit having a substantially identical sequence of the waveform data to the first unit-logic-circuit based on the limiting condition; and
  outputting the first unit-logic-circuit and the second unit-logic-circuit as redundant circuit information.

17. The non-transitory computer-readable recording medium according to claim 16, wherein the computer program stored therein causes the computer to further execute:
  detecting a repetitive interval in a sequence of the waveform data of the first unit-logic-circuit; and
  the detecting the second unit-logic-circuit includes detecting a unit-logic-circuit as the second unit-logic-circuit when the second unit-logic-circuit includes a substantially identical sequence of the waveform data to the repetitive interval.

* * * * *